(12) United States Patent
Lee et al.

(10) Patent No.: US 12,402,325 B2
(45) Date of Patent: Aug. 26, 2025

(54) MRAM STRUCTURE WITH CONTACT PLUG PROTRUDING OUT OF CONTACT HOLE AND METHOD OF FABRICATING THE SAME

(71) Applicant: UNITED MICROELECTRONICS CORP., Hsin-Chu (TW)

(72) Inventors: Yi-Hui Lee, Taipei (TW); I-Ming Tseng, Kaohsiung (TW); Ying-Cheng Liu, Tainan (TW); Yi-An Shih, Changhua County (TW); Yu-Ping Wang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 77 days.

(21) Appl. No.: 17/717,127

(22) Filed: Apr. 11, 2022

(65) Prior Publication Data

US 2022/0238600 A1   Jul. 28, 2022

Related U.S. Application Data

(62) Division of application No. 16/279,956, filed on Feb. 19, 2019, now abandoned.

(30) Foreign Application Priority Data

Jan. 14, 2019   (CN) .......................... 201910030836.9

(51) Int. Cl.
| | |
|---|---|
| *H10B 61/00* | (2023.01) |
| *H10N 50/01* | (2023.01) |
| *H10N 50/10* | (2023.01) |
| *H10N 50/80* | (2023.01) |

(52) U.S. Cl.
CPC ............. *H10B 61/10* (2023.02); *H10N 50/01* (2023.02); *H10N 50/10* (2023.02); *H10N 50/80* (2023.02)

(58) Field of Classification Search
CPC ....... H01L 27/224; H01L 43/02; H01L 43/08; H01L 43/12; H10B 61/10; H10N 50/80; H10N 50/01; H10N 50/10
USPC ......................................................... 257/421
See application file for complete search history.

(56) References Cited

U.S. PATENT DOCUMENTS

| | | |
|---|---|---|
| 8,962,349 B1 | 2/2015 | Chen |
| 9,502,466 B1 | 11/2016 | Chuang |
| 9,812,155 B1 | 11/2017 | Roy |
| 2005/0142845 A1 | 6/2005 | Lee |
| 2005/0260862 A1 | 11/2005 | Komatsu |
| 2008/0001207 A1 | 1/2008 | Guo |
| 2009/0261434 A1 | 10/2009 | Kang |
| 2011/0100410 A1 | 5/2011 | Takahashi |
| 2011/0272380 A1 | 11/2011 | Jeong |
| 2012/0325920 A1 | 12/2012 | Ozaki |

(Continued)

*Primary Examiner* — Eric W Jones
(74) *Attorney, Agent, or Firm* — Winston Hsu (57) ABSTRACT

An MRAM structure includes a dielectric layer. A contact hole is disposed in the dielectric layer. A contact plug fills in the contact hole and protrudes out of the dielectric layer. The contact plug includes a lower portion and an upper portion. The lower portion fills in the contact hole. The upper portion is outside of the contact hole. The upper portion has a top side and a bottom side greater than the top side. The top side and the bottom side are parallel. The bottom side is closer to the contact hole than the top side. An MRAM is disposed on the contact hole and contacts the contact plug.

8 Claims, 10 Drawing Sheets

(56) References Cited

U.S. PATENT DOCUMENTS

| | | |
|---|---|---|
| 2012/0326250 A1 | 12/2012 | Gaidis |
| 2013/0119494 A1 | 5/2013 | Li |
| 2015/0069480 A1 | 3/2015 | Kanaya |
| 2015/0069554 A1* | 3/2015 | Nakayama .............. H01L 43/02 |
| | | 257/421 |
| 2015/0075973 A1 | 3/2015 | Theodosiou |
| 2015/0287911 A1* | 10/2015 | Kim ....................... H10N 50/01 |
| | | 438/3 |
| 2015/0311251 A1 | 10/2015 | Yi |
| 2016/0027998 A1* | 1/2016 | Mudivarthi ............. H01L 43/08 |
| | | 257/421 |
| 2016/0064648 A1* | 3/2016 | Tsubata .................. H10N 50/10 |
| | | 257/421 |
| 2016/0072047 A1 | 3/2016 | Seto |
| 2016/0079519 A1 | 3/2016 | Yoshikawa |
| 2016/0380183 A1 | 12/2016 | Chuang |
| 2017/0069835 A1* | 3/2017 | Sonoda ................... H01L 43/12 |
| 2017/0117467 A1* | 4/2017 | Chang ................. H01L 45/1683 |
| 2017/0194557 A1 | 7/2017 | Chuang |
| 2017/0222128 A1 | 8/2017 | Sung |
| 2017/0263858 A1 | 9/2017 | Sonoda |
| 2017/0263860 A1 | 9/2017 | Seto |
| 2017/0294576 A1 | 10/2017 | Huang |
| 2018/0040817 A1* | 2/2018 | Chuang .................. H10N 70/20 |
| 2018/0097173 A1* | 4/2018 | Chuang .................. H10N 50/85 |
| 2018/0269386 A1 | 9/2018 | Tsubata |
| 2019/0148150 A1 | 5/2019 | Lee |
| 2019/0393409 A1* | 12/2019 | Maniscalco ....... H01L 21/76843 |

* cited by examiner

FIG. 15

MRAM STRUCTURE WITH CONTACT PLUG PROTRUDING OUT OF CONTACT HOLE AND METHOD OF FABRICATING THE SAME

CROSS REFERENCE TO RELATED APPLICATIONS

This application is a division of U.S. application Ser. No. 16/279,956, filed on Feb. 19, 2019. The content of the application is incorporated herein by reference.

BACKGROUND OF THE INVENTION

1. Field of the Invention

The present invention relates to an MRAM (magnetoresistive random access memory) structure, and more particularly, to a method of fabricating the MRAM structure through an ion beam etch process.

2. Description of the Prior Art

Many modern day electronic devices contain electronic memory configured to store data. Electronic memory may be volatile memory or non-volatile memory. Volatile memory stores data only while it is powered, while non-volatile memory is able to store data when power is removed. MRAM is one promising candidate for next generation non-volatile memory technology. An MRAM cell includes a magnetic tunnel junction (MTJ) having a variable resistance, located between two electrodes disposed within back-end-of-the-line (BEOL) metallization layers.

An MTJ generally includes a layered structure comprising a reference layer, a free layer and a dielectric barrier in between. The reference layer of magnetic material has a magnetic vector that always points in the same direction. The magnetic vector of the free layer is free, but is determined by the physical dimensions of the element. The magnetic vector of the free layer points in either of two directions: parallel or anti-parallel with the magnetization direction of the pinned layer.

Conventional MRAMs have some disadvantages, however. For example, the structures of the contact plugs under the MRAMs have defects. An improved MRAM structure is therefore required in the field.

SUMMARY OF THE INVENTION

According to a preferred embodiment of the present invention, an MRAM structure includes a dielectric layer. A contact hole is disposed in the dielectric layer. A contact plug fills in the contact hole and protrudes out of the dielectric layer, wherein the contact plug comprises a lower portion and an upper portion, the lower portion fills in the contact hole, the upper portion is outside of the contact hole, the upper portion has a top side, a bottom side, a first sloping side and a second sloping side, the top side and the bottom side are parallel, the bottom side is closer to the contact hole than the top side, the bottom side is larger than the top side, two ends of the first sloping side respectively connect the top side and the bottom side, and two ends of the second sloping side respectively connect the top side and the bottom side. An MRAM is disposed on the contact hole and directly contacts the contact plug.

According to another preferred embodiment of the present invention, a fabricating method of an MRAM structure includes providing a metal line and a dielectric layer covering the metal line. Later, a contact hole in the dielectric layer is formed and the metal line is exposed through the contact hole. Next, a first metal layer is formed to cover and fill the contact hole. Subsequently, a first planarization process is performed to planarize the first metal layer. After that, a bottom electrode, an MTJ material layer and a top electrode are formed to cover the first metal layer after the first planarization process. Finally, an ion beam etch process is performed to pattern the top electrode, the MTJ material layer, the bottom electrode and the first metal layer to form an MRAM and a contact plug.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a fabricating method of an MRAM structure according to a first preferred embodiment of the present invention, wherein:

FIG. 9 to FIG. 11 depict a fabricating method of an MRAM structure according to a second preferred embodiment of the present invention, wherein:
FIG. 12 to FIG. 13 depict a fabricating method of an MRAM structure according to a third preferred embodiment of the present invention, wherein:
FIG. 14 to FIG. 15 depict a fabricating method of contact plugs according to a fourth preferred embodiment of the present invention, wherein.

DETAILED DESCRIPTION

Figure 1:
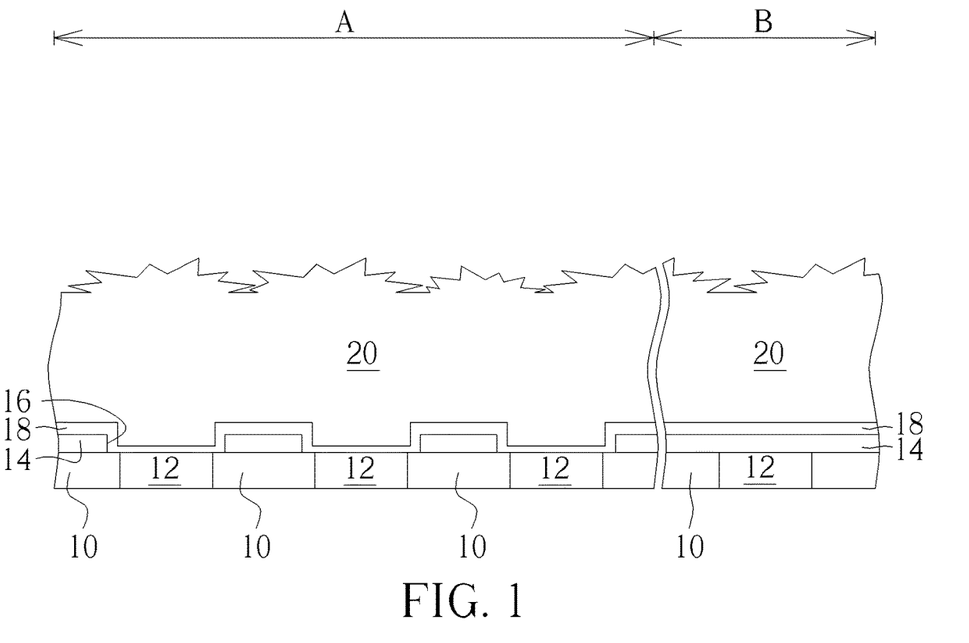
FIG. 1 depicts a dielectric layer with a memory device region and a logic device region.

FIG. 1 to FIG. 8 depict a fabricating method of an MRAM structure according to a first preferred embodiment of the present invention. As shown in FIG. 1, a dielectric layer 10 is provided. The dielectric layer 10 is divided into a memory device region A and a logic device region B. Metal lines 12 are respectively disposed in the dielectric layer 10 within the memory device region A and the logic device region B. In the embodiment of the present invention, three metal lines 12 are disposed in the memory device region A, and one metal line 12 is disposed in the logic device region B. The metal lines 12 may be part of a metal interconnection. The dielectric layer 10 serves as an interlayer dielectric. Next, a dielectric layer 14 is disposed on the dielectric layer 10. The dielectric layer 10 and the dielectric layer 14 may be silicon oxide, silicon nitride, silicon carbon nitride, silicon oxynitride or silicon oxycarbonitride. Then, a contact hole 16 is formed in the dielectric layer 14 within the memory device region A to expose the metal lines 12 through the contact hole 16. There are several contact holes 16 shown in this embodiment. Each of the metal lines 12 respectively serves as a bottom of one contact hole 16. Later, a barrier 18 is formed to conformally cover the contact holes 16 and the dielectric layer 14. The barrier 18 is preferably Ti/TiN composite layer, TaN or other suitable conductive materials. Then, a metal layer 20 fills into the contact holes 16 and covers the dielectric layer 14. The metal layer 20 is preferably tungsten, but not limited thereto. Other metals such as aluminum or copper can be the material of the metal layer 20. The fabricating step of the barrier 18 and the metal layer 20 may be deposition processes, such as chemical vapor deposition processes, physical vapor deposition processes or atomic layer deposition processes.

Figure 2:
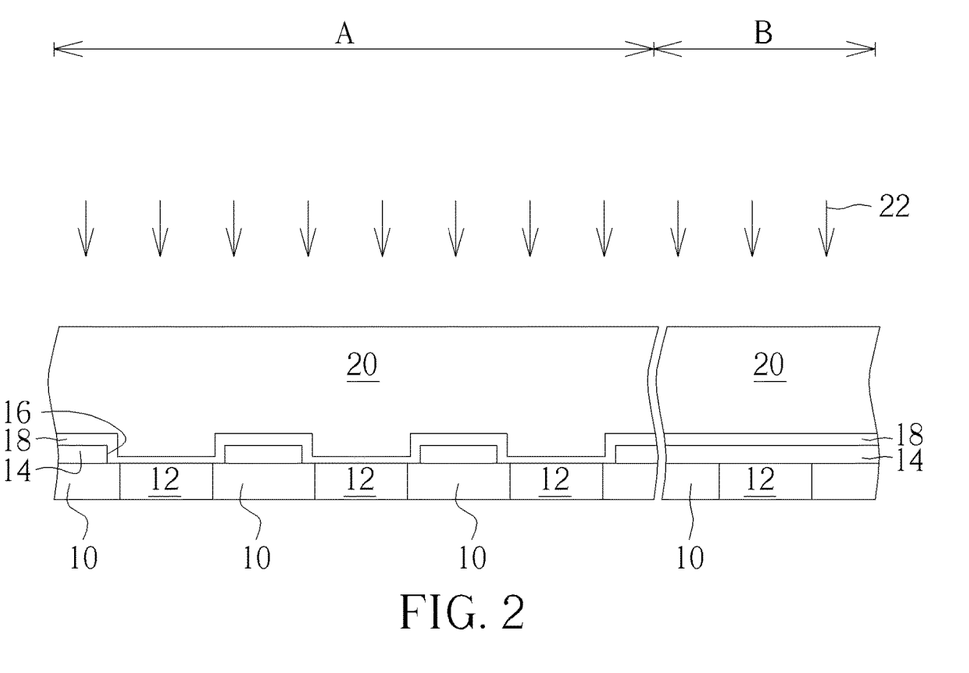
FIG. 2 is a fabricating stage following FIG. 1.
Figure 3:
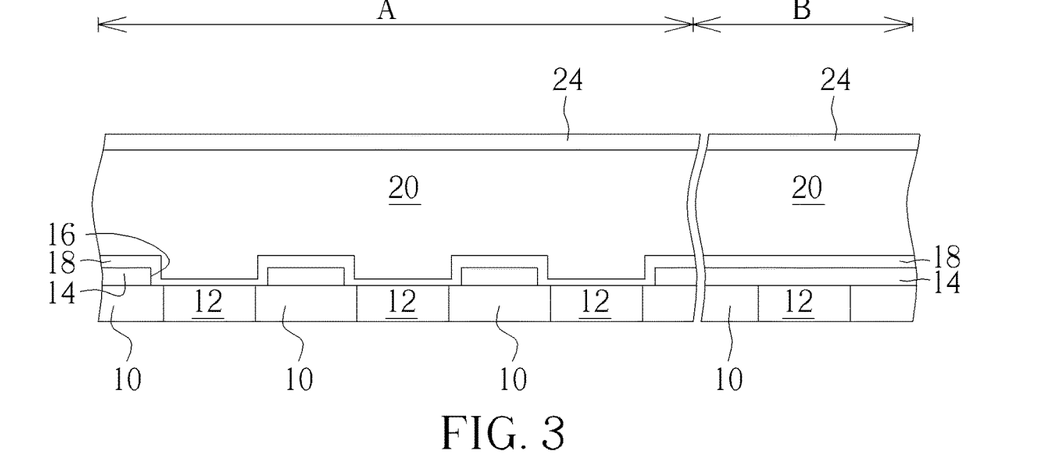
FIG. 3 is a fabricating stage following FIG. 2.

As shown in FIG. 2, a planarization process 22 is performed to planarize the metal layer 20. After planarizing the metal layer 20, part of the metal layer 20 is still outside of the contact holes 16, so a top surface of the metal layer 20 is higher than a top surface of the barrier 18. The planarization process 22 may be a chemical mechanical planarization. As shown in FIG. 3, a bottom electrode 24 is formed to cover the metal layer 20. Next, the bottom electrode 24 is planarized. According to a preferred embodiment of the present invention, another chemical mechanical planarization can be used to planarize the bottom electrode 24. The bottom electrode 24 can be tantalum or other metals. The formation of the bottom electrode 24 can be a deposition process such as a chemical vapor deposition process, a physical vapor deposition process or an atomic layer deposition process.

Figure 4:
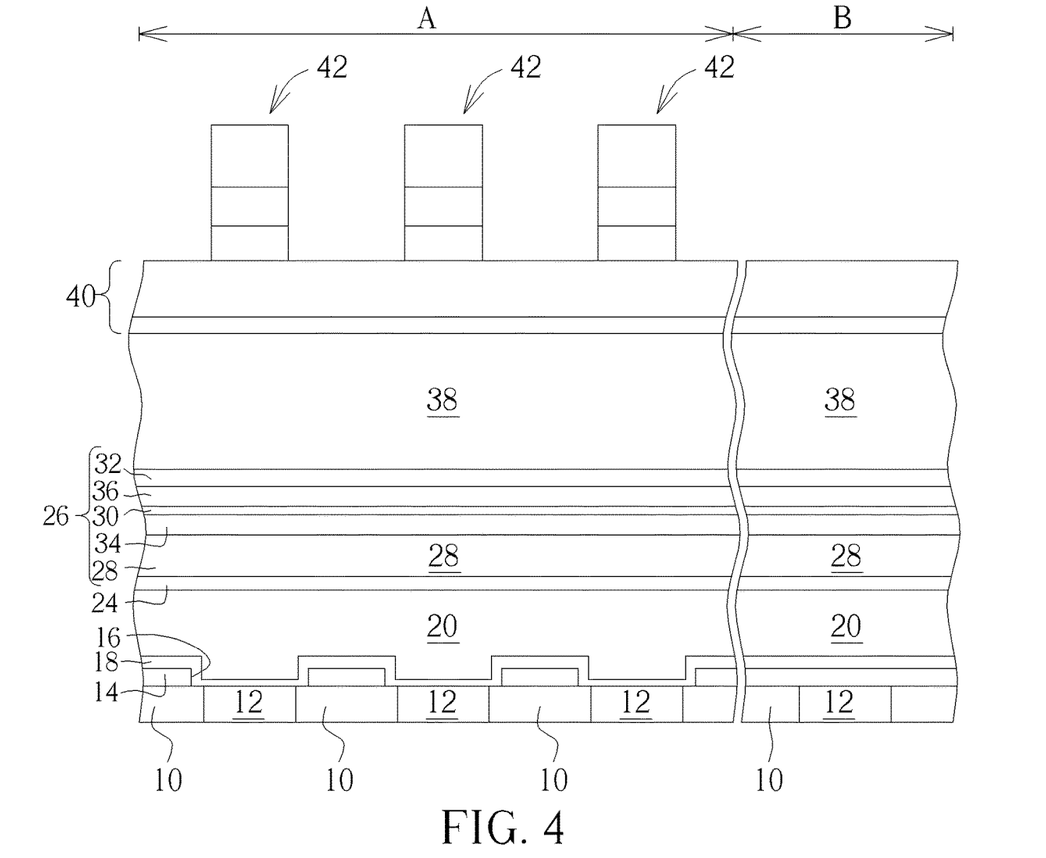
FIG. 4 is a fabricating stage following FIG. 3.

As shown in FIG. 4, a magnetic tunnel junction (MTJ) material layer 26 is formed to cover the bottom electrode 24. The MTJ material layer 26 can be formed by forming a first ferromagnetic material 28, an insulating layer 28 and a second ferromagnetic material 32 in sequence. An interlayer 34 can be formed between the insulating layer 30 and the first ferromagnetic material 28. An interlayer 36 can be formed between the insulating layer 30 and the second ferromagnetic material 32. The first ferromagnetic material 28 will serve as a reference layer for an MTJ, and a direction of magnetic dipole moment reference layer is fixed. The second ferromagnetic material 32 will serve as a free layer for the MTJ and the free layer alters its direction of magnetic dipole moment based on different circumstances. The insulating layer 30 serves as a tunneling barrier for the MTJ. The materials of the first ferromagnetic material 28 and the second ferromagnetic material 32 can independently select from Co, Pt, Co/Ni alloy, Co/Pd alloy, Fe/B alloy, Co/Pt alloy, Gd/Fe alloy, Co/Fe alloy, Co/Fe/B alloy or Ta/Fe/Co alloy. The insulating layer 30 can be MgO or $Al_2O_3$. The interlayer 34 and the interlayer 36 can be Co/Fe alloy. Later, a top electrode 38 is formed to cover the second ferromagnetic material 32. The top electrode 38 can be tantalum or other conductive materials. After that, a mask layer 40 and a patterned photoresist 42 are formed in sequence. The mask layer 40 may include silicon oxide or silicon nitride. The patterned photoresist 42 defines the position of the MRAM structure in the memory device region A. The first ferromagnetic material 28, the interlayers 34/36, the insulating layer 30, the second ferromagnetic material 32, the top electrode 38 and the mask layer 40 can be formed by deposition processes. The patterned photoresist 42 can be formed by a deposition process and a lithographic process.

Figure 5:
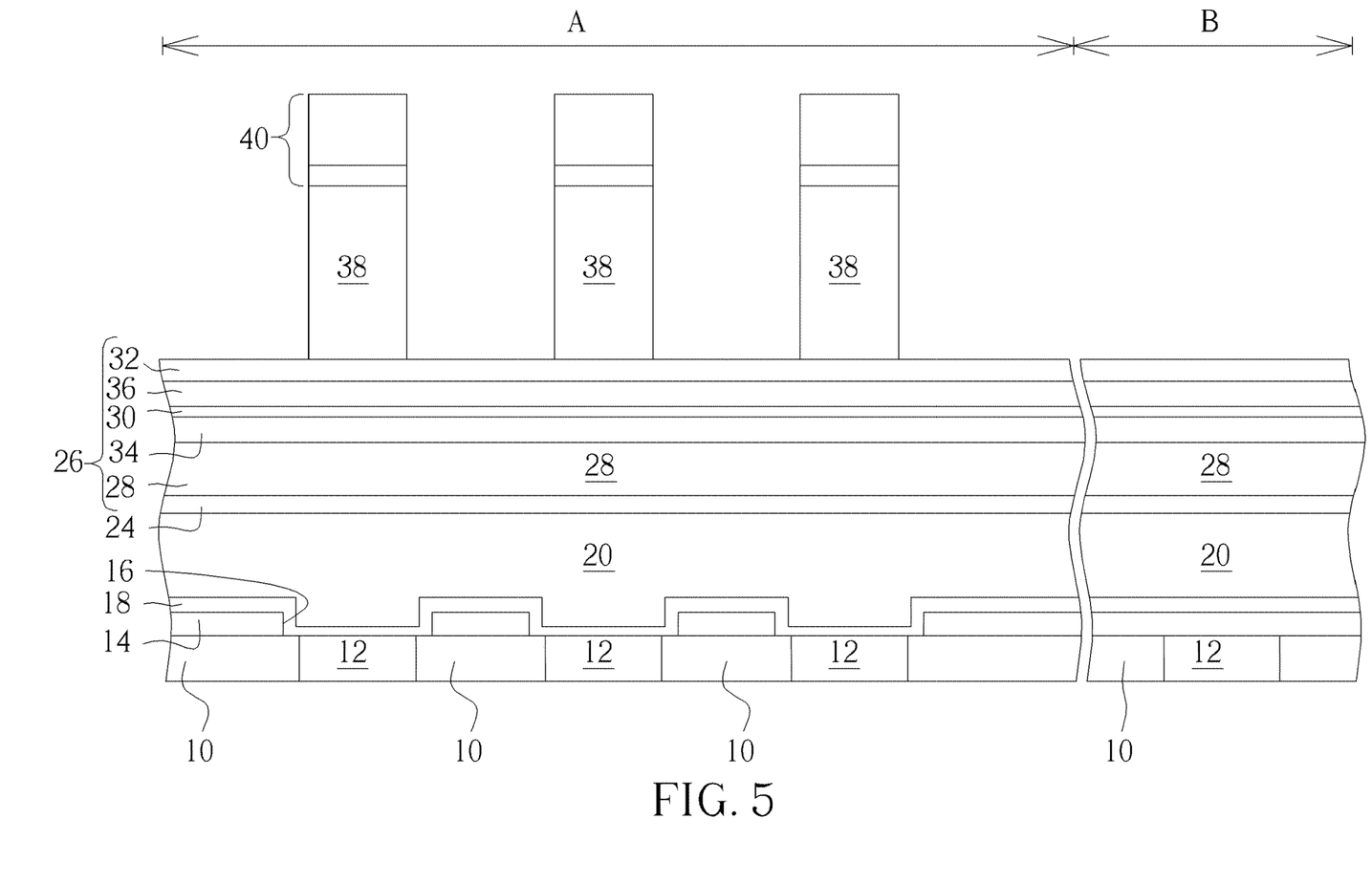
FIG. 5 is a fabricating stage following FIG. 4.
Figure 6:
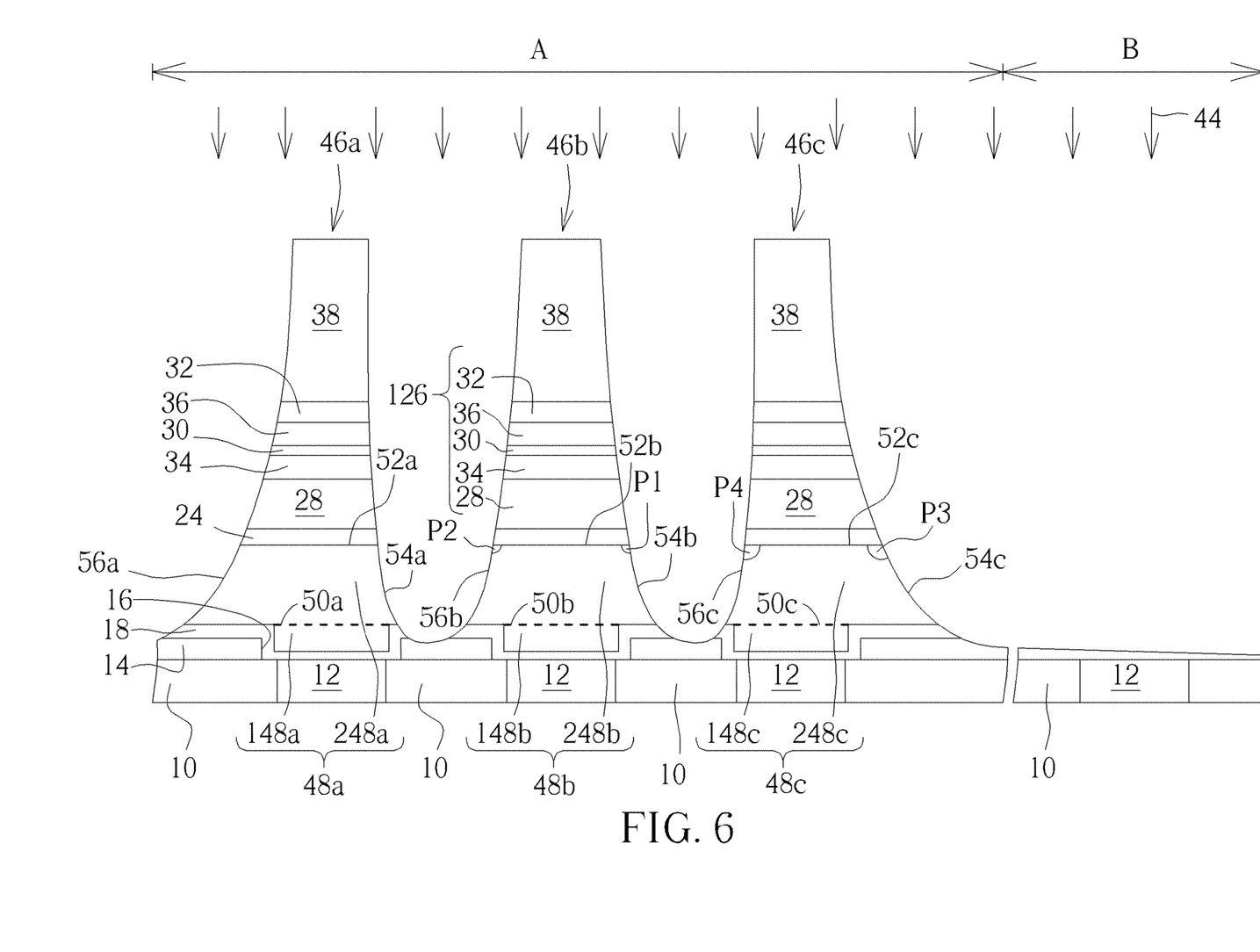
FIG. 6 is a fabricating stage following FIG. 5.

As shown in FIG. 5, the mask layer 40 and the top electrode 38 are etched through a reactive ion etch process by using the patterned photoresist 42 as a mask. During the reactive ion etch process, the patterned photoresist 42 may be consumed. After the reactive ion etch process, the mask layer 40 is removed. As shown in FIG. 6, an ion beam etch process 44 is performed to pattern the MTJ material layer 26, the bottom electrode 24, the metal layer 20 and the barrier 18 by using the remaining top electrode 38 as a mask. After the ion beam etch process 44, the MTJ material layer 26, the top electrode 38 and the bottom electrode are defined as three MRAMs 46a/46b/46c. The metal layer 20 below the MRAMs 46a/46b/46c becomes three contact plugs 48a/48b/48c. Each of the MRAMs 46a/46b/46c includes the top electrode 38, the MTJ 126 and the bottom electrode 24. The top electrode 38, the MTJ material layer 26, the bottom electrode 24, the metal layer 20 and the barrier 18 within the logic device region B are removed completely.

Furthermore, the contact plugs 48a/48b/48c respectively electrically connect to the metal layer 20 and the MRAM 46a/46b/46c. Each of the contact plugs 48a/48b/48c respectively includes one of the lower portions 148a/148b/148c and one of the upper portions 248a/248b/248c, wherein the lower portions 148a/148b/148c fill in the corresponding contact holes 16 and the upper portions 248a/248b/248c are outside of the contact holes 16. The lower portions 148a/148b/148c are preferably rectangular. Each of the lower portions 148a/148b/148c extends from the corresponding contact holes 16 and respectively connects to the corresponding upper portions 248a/248b/248c. Each of the upper portions 248a/248b/248c respectively has a top side 52a/52b/52c, a bottom side 50a/50b/50c, a first sloping side 54a/54b/54c and a second sloping side 56a/56b/56c. The bottom side 50a/50b/50c is greater than the opening of each of the contact holes 16. The interface between the upper portions 248a/248b/248c and the lower portions 148a/148b/148c are marked by dashed lines. Although the present invention takes three MRAMs 46a/46b/46c and three contact plugs 48a/48b/48c as an example, the numbers of MRAMs and contact plugs can be altered based on different requirements.

It is noteworthy that the top electrode 38, the MTJ material layer 26, the bottom electrode 24, the barrier layer 18 and the metal layer 20 are etched by the ion beam etch process 44 rather than a reactive ion etch process. Because the etching ratios of the ion beam etch process 44 to any material are similar values, the MTJ material layer 26, the top electrode 38 and the bottom electrode 24 can be etched at the same rate during the ion beam etch process 44. Therefore, the sidewalls of the MRAMs 46a/46b/46c will become more aligned. On the other hand, as the reactive ion etching process is etched by chemical reactions, the etching ratio to different materials in the reactive ion etching process differs a lot. If the reactive ion etching process is used to etch the top electrode 38, the MTJ material layer 26, the bottom electrode 24, the barrier layer 18 and the metal layer 20, the sidewall of the MRAMs will become uneven like a stair. This will influence the electric property of the MRAMs 46a/46b/46c. Moreover, the sidewalls of MRAMs 46a/46b/46c and the sidewalls contact plugs 48a/48b/48c formed by the ion beam etch process 44 respectively form several continuous sloping sides, whereas the sidewalls of the MRAMs and the sidewalls of the contact plugs formed by the ion reactive etching process are perpendicular to the top surface of the dielectric layer 10.

Figure 7:
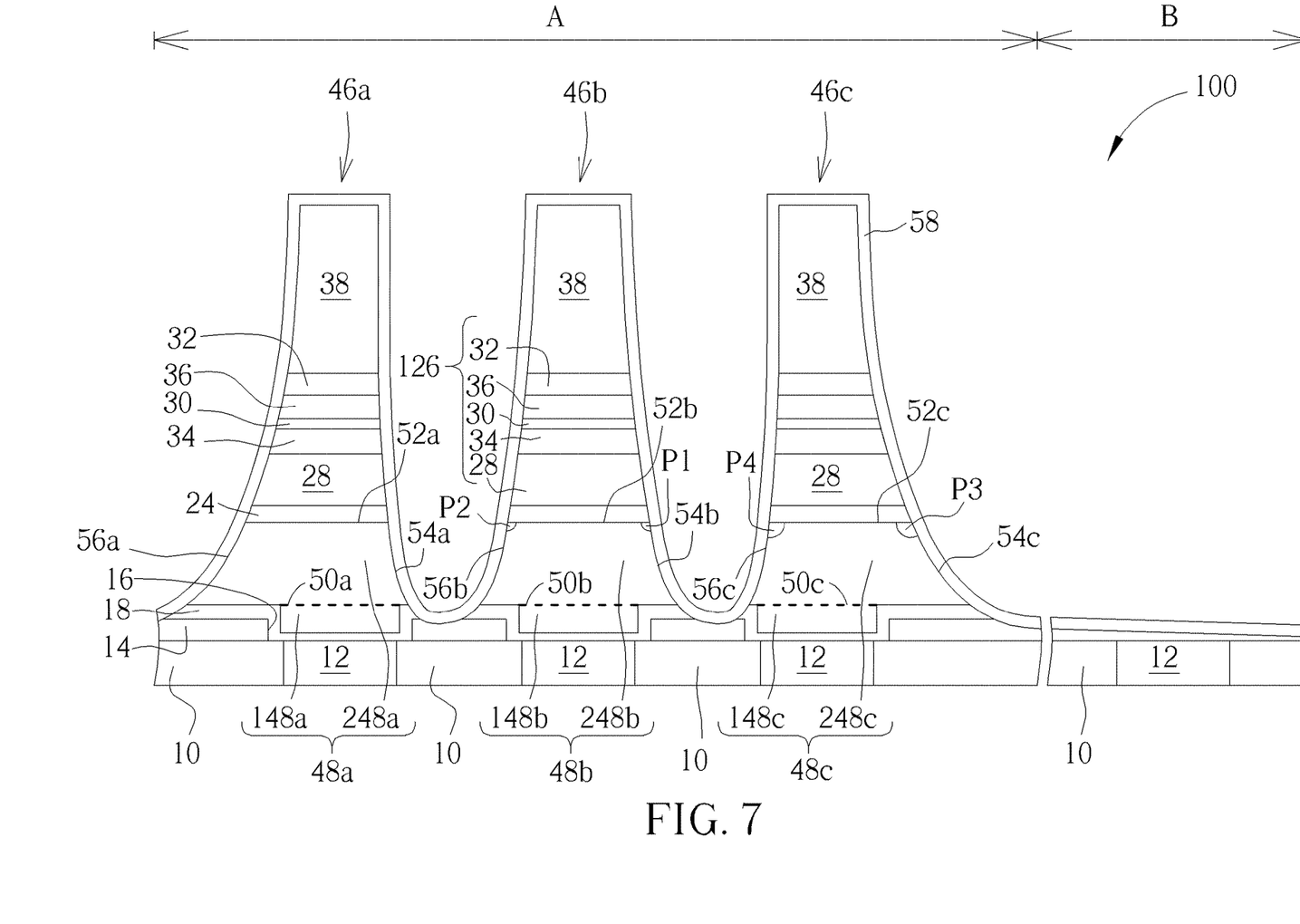
FIG. 7 is a fabricating stage following FIG. 6.

As shown in FIG. 7, a spacer material layer 58 is formed to cover the memory device region A and the logic device region B. The spacer material layer 58 can be silicon nitride. The spacer material layer 58 covers the MRAMs 46a/46b/46c and the contact plugs 48a/48b/48c. The first sloping side 54a/54b/54c and the second sloping side 56a/56b/56c are entirely covered by the spacer material layer 58. At this point, the MRAM structure 100 of the present invention is completed. It is noteworthy that the formation of the spacer material layer 58 and the ion beam etch process 44 are performed in the same chamber for preventing the oxidation of metals in the MTJ 126, avoiding the contaminant formed during the ion beam etch process 44 from being brought to the next chamber and preventing the material layer formed afterwards from contacting the metals in the MTJ 126.

Figure 8:
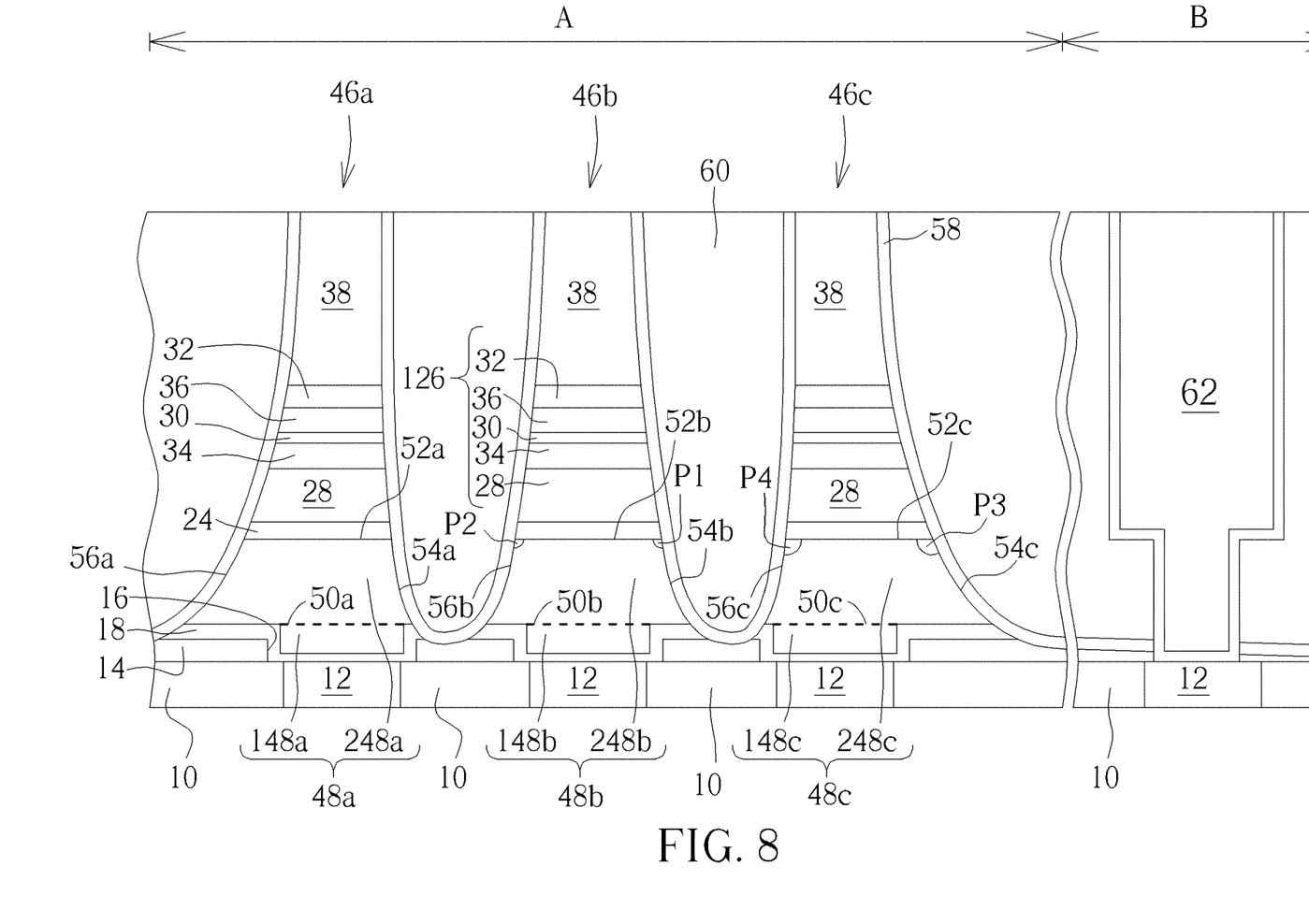
FIG. 8 is a fabricating stage following FIG. 7.

As shown in FIG. 8, a dielectric layer 60 is formed to cover the spacer material layer 58. Later, a metal interconnection 62 is formed in the logic region B, wherein the metal interconnection 62 contacts the metal line 12 within the logic region device. B.

Figure 9:
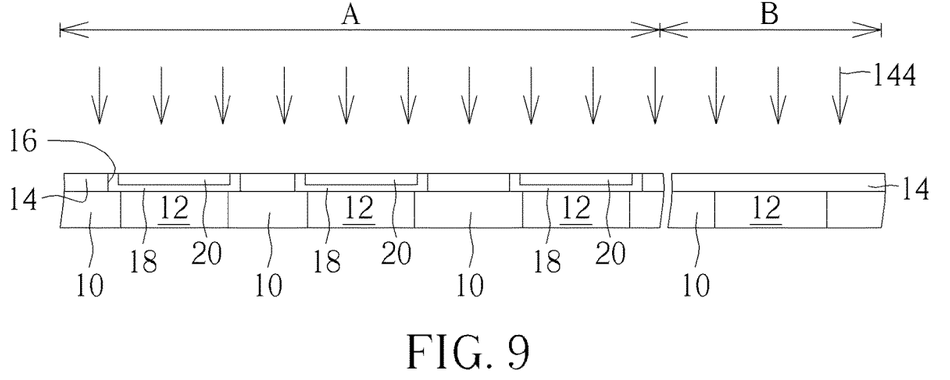
FIG. 9 depicts a dielectric layer with a memory device region and a logic device region.
Figure 10:
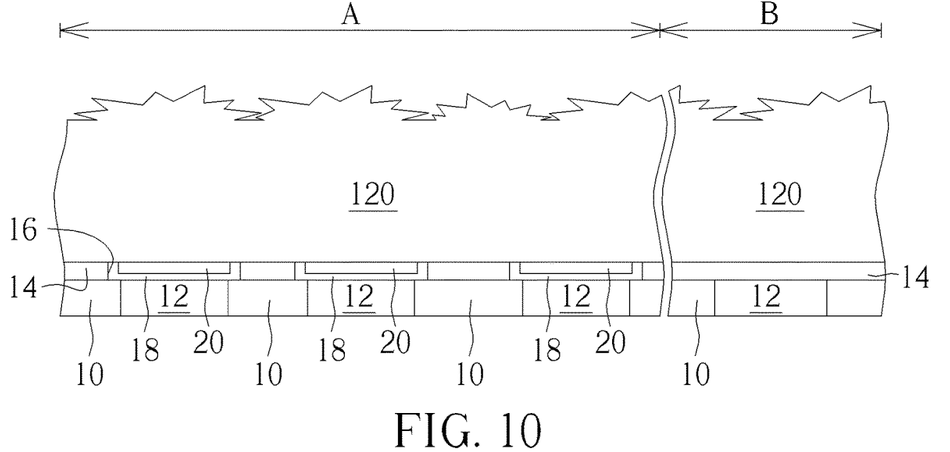
FIG. 10 is a fabricating stage following FIG. 9.
Figure 11:
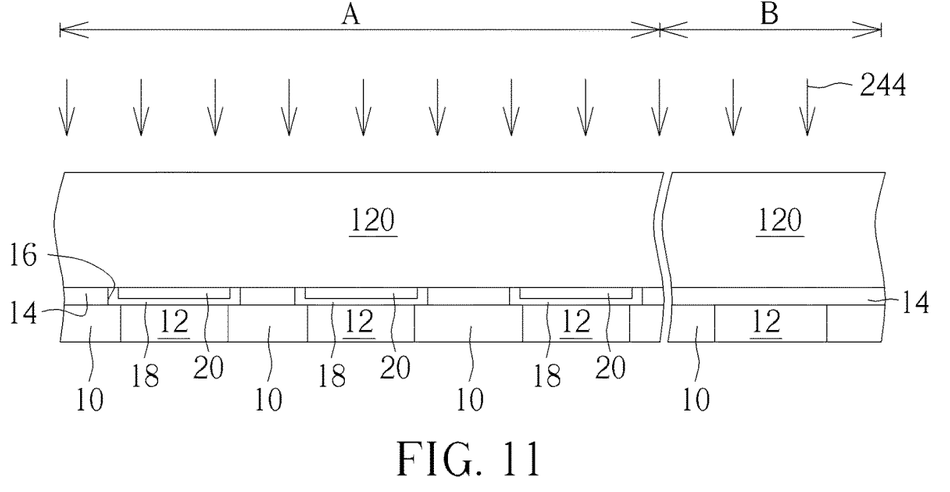
FIG. 11 is a fabricating stage following FIG. 10.

FIG. 9 to FIG. 11 depict a fabricating method of an MRAM structure according to a second preferred embodiment of the present invention, wherein elements which are substantially the same as those in the first preferred embodiment are denoted by the same reference numerals; an accompanying explanation is therefore omitted. According to the second preferred embodiment, after the metal layer 20 is formed as shown in FIG. 1, the step shown in FIG. 9 is performed. As shown in FIG. 9, the metal layer 20 and the barrier 18 outside of the contact holes 16 are entirely removed by a planarization process 144, and the top surface of the dielectric layer 14 is exposed. As shown in FIG. 10, a metal layer 120 is formed to cover the metal layer 20, and part of the metal layer 120 directly contacts the top surface of the dielectric layer 14. As shown in FIG. 11, a planarization process 244 is performed to planarize the metal layer 120. After the step shown in FIG. 11, the steps in FIG. 3 to FIG. 8 can be performed to form the MRAM structure 100.

Figure 12:
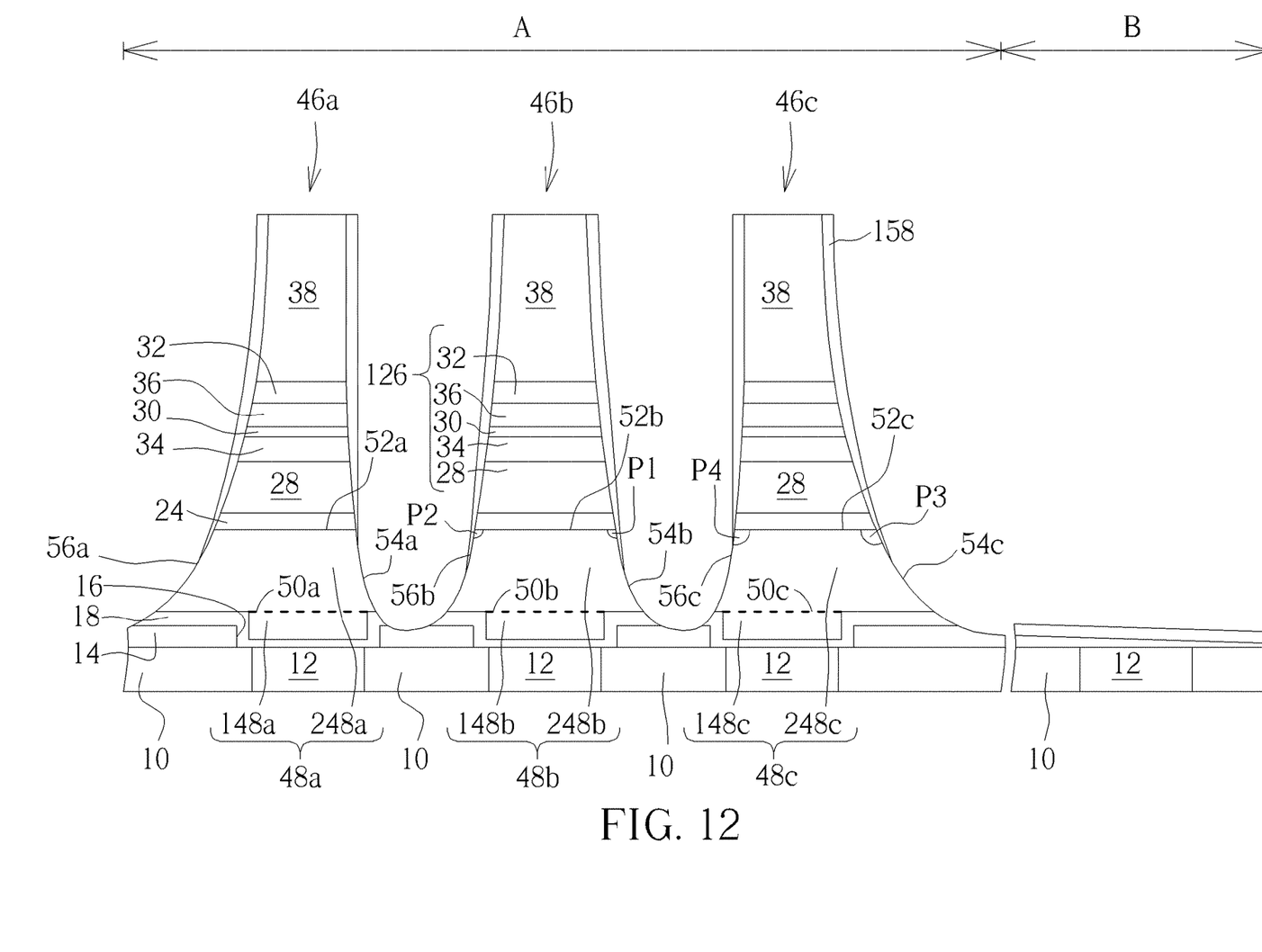
FIG. 12 depicts spacers disposed on MRAMs.
Figure 13:
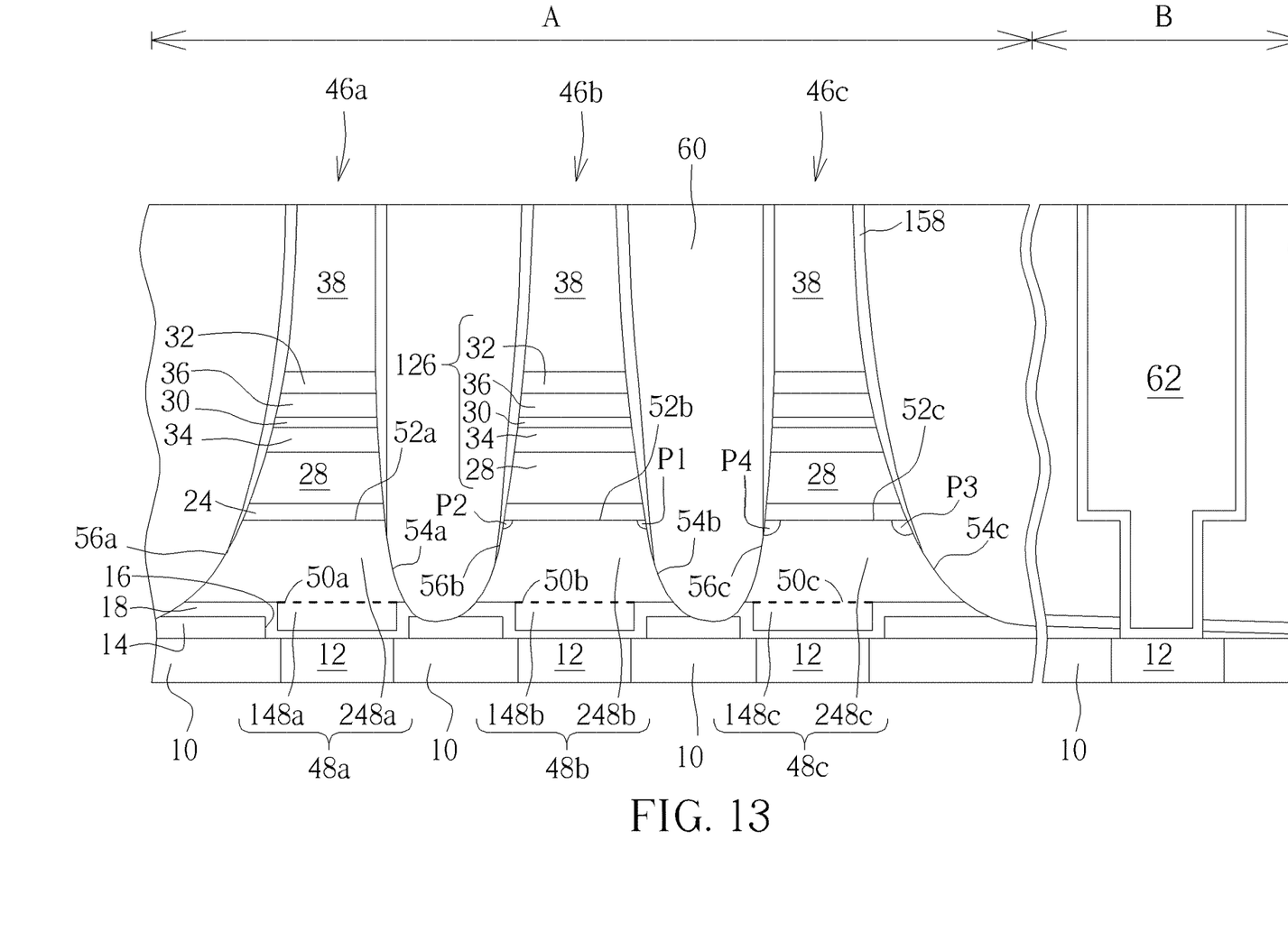
FIG. 13 is a fabricating stage following FIG. 12.

FIG. 12 to FIG. 13 depict a fabricating method of an MRAM structure according to a third preferred embodiment of the present invention, wherein elements which are substantially the same as those in the first preferred embodiment are denoted by the same reference numerals; an accompanying explanation is therefore omitted. After forming the spacer material layer 58 as shown in FIG. 12, the spacer material layer 58 can be etched in the step shown in FIG. 12 to make the spacer material layer 58 become several spacers 158. The spacers 158 are respectively disposed at two side of each of the MRAMs 46a/46b/46c. The spacers 158 disposed on different MRAMs are not connected to each other. It is noteworthy that the first sloping sides 54a/54b/54c and the second sloping sides 56a/56b/56c of the corresponding contact plugs 48a/48b/48c are not entirely covered by the spacers 158. That is, at least part of the spacer material layer 58 on the first sloping sides 54a/54b/54c and the second sloping sides 56a/56b/56c are removed. After forming the spacers 58, the step in FIG. 13 can be performed to form a dielectric layer 60 to cover the spacers 158. Later, a metal interconnection 62 is formed within the logic device region B. The metal interconnection 62 contacts the metal line 12 in the logic device region B.

As shown in FIG. 7, an MRAM structure 100 includes a dielectric layer 14. A contact hole 16 is disposed in the dielectric layer 14. A contact plug 48b fills in the contact hole 16 and protrudes out of the dielectric layer 14. The contact plug 48b includes a lower portion 148b and an upper portion 248b. The lower portion 148b fills in the contact hole 16. The upper portion 248b is outside of the contact hole 16. The lower portion 148 extends from the contact hole 16 to connect with the upper portion 248b. The upper portion 248b has a top side 52b, a bottom side 50b, a first sloping side 54b and a second sloping side 56b. The top side 52b and the bottom side 50b are parallel. The bottom side 50b is closer to the contact hole 16 than the top side 52b. The bottom side 50b is greater than the top side 52b. Two ends of the first sloping side 54b respectively connect the top side 52b and the bottom side 50b. Two ends of the second sloping side 56b respectively connect the top side 52b and the bottom side 50b. The bottom side 50b is greater than the opening of the contact hole 16. A barrier 18 is disposed between the contact plug 48b and the dielectric layer 14, and the barrier 18 covers the sidewall of the contact hole 16 and the top surface of the dielectric layer 14. According to another preferred embodiment of the present invention, the barrier 18 can only cover the inner sidewall of the contact hole 16 and does not cover the top surface of the dielectric layer 14. The barrier 18 can be Ti/TiN composite layer, tantalum nitride or other suitable conductive materials.

A dielectric layer 10 is disposed below the dielectric layer 14. A metal line 12 is disposed in the dielectric layer 10 and electrically connects to the contact plug 48b. The contact plug 48b is monolithic and is made of a single material. According to a preferred embodiment of the present invention, the contact plug 48b is preferably made of tungsten, but not limited thereto. Other metals such as aluminum or copper can be used to form the contact plug 48b.

An MRAM 46b is disposed on the contact plug 48b and contacts the contact plug 48b. The MRAM 46b includes a MTJ 126, a top electrode 38 and a bottom electrode 24. The bottom electrode 24 contacts the contact plug 48b. The MTJ 126 is between the top electrode 38 and the bottom electrode 24. The MTJ 126 includes a first ferromagnetic material 28, an insulating layer 30 and a second ferromagnetic material 32. The insulating layer 30 is between the first ferromagnetic material 28 and the second ferromagnetic material 32. An interlayer 34 is between the insulating layer 30 and the first ferromagnetic material 28. An interlayer 36 is between the insulating layer 30 and the second ferromagnetic material 32. A spacer material layer 58 completely covers the first sloping side 54b and the second sloping side 56b. The spacer material layer 58 extends to the MRAM 46b. According to another preferred embodiment of the present invention, as shown in FIG. 12, a spacer 158 only covers part of the first sloping side 54b and part of the second sloping side 56b.

In general, several MRAMs and contact plugs are arranged on the dielectric layer 14 to form a memory array. FIG. 7 takes three MRAMs 46a/46b/46c and three contact plugs 48a/48b/48c as an example. Because the MRAMs 46a/46b/46c and contact plugs 48a/48b/48c are defined by the ion beam etch process 44, the contact plug 48b in the middle has a different profile from that of the contact plugs 48a/48c at the right side and the left side. The profile of the MRAM 46b in the middle is also different from that of the MRAMs 46a/46c at the right side and the left side. Both of the contact plugs 48b in the middle and the MRAM 46b in the middle have a left-right symmetric profile. The contact plugs 48a/48c and the MRAMs 46a/46c individually have a left-right asymmetric profile. The following description takes the contact plug 48b in the middle and the contact plug 48c at the right side as an example. A first angle P1 is disposed between the first sloping side 54b and the top side 52b of the contact plug 48b. A second angle P2 is disposed between the second sloping side 56b and the top side 54b of the contact plug 48b. The size (in degrees) of the first angle P1 equals the size of the second angle P2. A first angle P3 is disposed between the first sloping side 54c and the top side 52c. A second angle P4 is disposed between the second sloping side 56c and the top side 52c. The size (in degrees) of the first angle P3 does not equal the size of the second angle P4.

Figure 14:
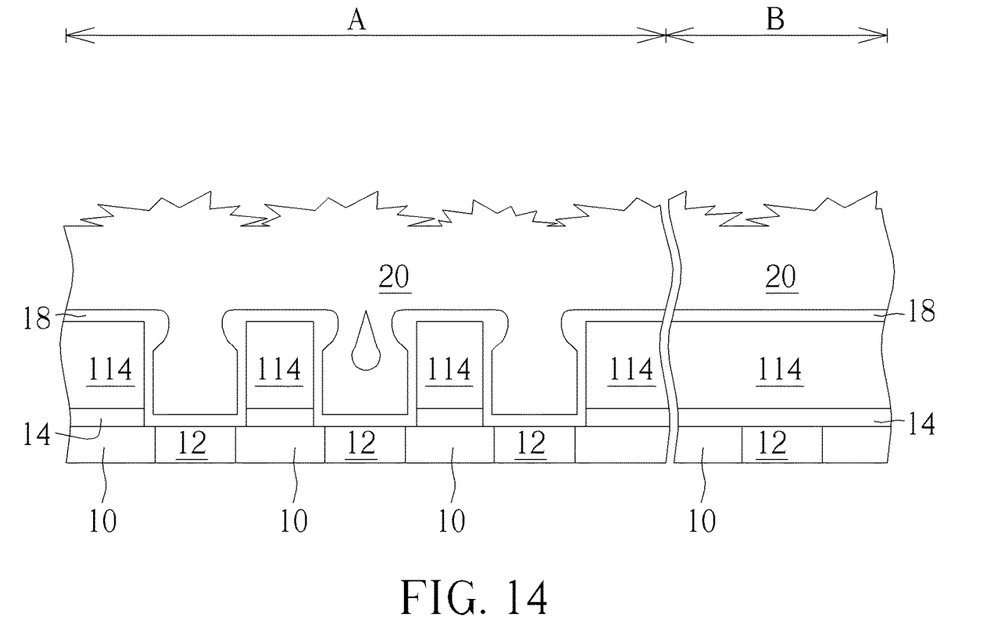
FIG. 14 depicts forming another dielectric layer 114 on a dielectric layer.
Figure 15:
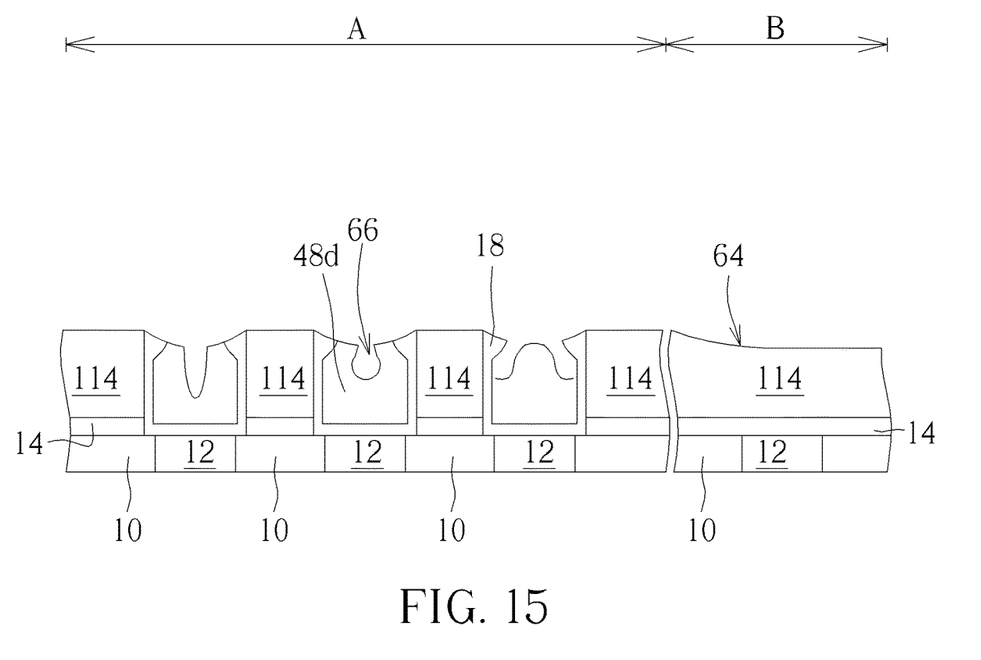
FIG. 15 is a fabricating stage following FIG. 14.

FIG. 14 to FIG. 15 depict a fabricating method of contact plugs according to a fourth preferred embodiment of the present invention, wherein elements which are substantially the same as those in the first preferred embodiment are denoted by the same reference numerals; an accompanying explanation is therefore omitted. As shown in FIG. 14, another dielectric layer 114 is formed on the dielectric layer 14. Later, a metal layer 20 is formed to cover the dielectric layer 114. Then, the metal layer 20 is planarized by a chemical mechanical planarization to make the top surface of the metal layer 20 align with the top surface of the dielectric layer 114. The metal layer 20 which is planarized becomes contact plugs 48d entirely embedded in the dielectric layer 114. The disadvantage of the fourth preferred embodiment is that the chemical mechanical planarization leads to dishing on the surface of the dielectric layer 114, and holes 66 in the contact plugs 48d. The dishing 64 and holes 66 will influence the property of the MRAM. Therefore, the dielectric layer 114 is omitted in the first preferred embodiment and the second preferred embodiment of the present invention. In this way, the chemical mechanical planarization does not need to stop on the dielectric layer 114 during the planarization of the metal layer 20, and the dishing 64 and holes 66 can be prevented. Furthermore, the MRAMs 46a/46b/46c in the first, second and third preferred embodiments of the present invention are formed by the ion beam etch process 44. Therefore, the sidewalls of the MRAMs 46a/46b/46c are flat and even.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of an MRAM structure, comprising:
    providing a metal line and a dielectric layer covering the metal line;
    forming a contact hole in the dielectric layer and exposing the metal line through the contact hole;
    forming a first metal layer covering and filling the contact hole;
    performing a first planarization process to planarize the first metal layer;
    forming a bottom electrode, an MTJ material layer and a top electrode covering the first metal layer after the first planarization process;
    performing an ion beam etch process to pattern the top electrode, the MTJ material layer, the bottom electrode and the first metal layer at one etching step to form an MRAM and a contact plug, wherein the contact plug is disposed below the MTJ material layer; and
    forming a spacer material layer covering and physically contacting a sidewall of the top electrode, a sidewall of the MTJ material layer, and a sidewall of the bottom electrode, and covering and contacting the contact plug, wherein the spacer material layer is silicon nitride;
    wherein the contact plug fills in the contact hole and protrudes from the dielectric layer, the contact plug has a lower portion and an upper portion, the lower portion fills in the contact hole, the upper portion is outside of the contact hole, the upper portion has a top side, a bottom side, a first sloping side and a second sloping side, the top side and the bottom side are parallel, the bottom side is closer to the contact hole than the top side, the bottom side is greater than the top side, two ends of the first sloping side respectively connect the top side and the bottom side, two ends of the second sloping side respectively connect the top side and the bottom side, a first angle is disposed between the first sloping side and the top side, a second angle is disposed between the second sloping side and the top side, and a size of the first angle does not equal to a size of the second angle.

2. The fabricating method of an MRAM structure of claim 1, further comprising etching the spacer material layer to form two spacers at two sides of the MRAM, wherein part of the contact plug is not covered by the spacer.

3. The fabricating method of an MRAM structure of claim 1, wherein the contact plug contacts the metal line.

4. The fabricating method of an MRAM structure of claim 1, wherein after planarizing the first metal layer, part of the first metal layer is outside of the contact hole.

5. The fabricating method of an MRAM structure of claim 1, further comprising:
    before forming the first metal layer, forming a barrier contacting the contact hole and a top surface of the dielectric layer, wherein after planarizing the first metal layer, a top surface of the first metal layer is aligned with the dielectric layer and the barrier on the top surface of the dielectric layer is removed.

6. The fabricating method of an MRAM structure of claim 5, further comprising:
    after planarizing the first metal layer, forming a second metal layer covering the first metal layer; and
    performing a second planarization process to planarize the second metal layer, wherein after planarizing the second metal layer, part of the second metal layer is outside of the contact hole.

7. The fabricating method of an MRAM structure of claim 1, wherein the bottom side is greater than an opening of the contact hole, and under a cross-sectional view, the lower portion is rectangular.

8. The fabricating method of an MRAM structure of claim 1, further comprising:
    after forming the contact hole in the dielectric layer, forming a barrier covering and contacting the contact hole and the dielectric layer; and
    after forming the barrier, forming the first metal layer covering and filling the contact hole; wherein the top electrode, the MTJ material layer, the bottom electrode, the first metal layer and the barrier are patterned at one etching step to form the MRAM and the contact plug during the ion beam etch process.

* * * * *